(12) United States Patent
Lensing

(10) Patent No.: US 6,383,824 B1
(45) Date of Patent: May 7, 2002

(54) METHOD OF USING SCATTEROMETRY MEASUREMENTS TO CONTROL DEPOSITION PROCESSES

(75) Inventor: Kevin R. Lensing, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/843,111

(22) Filed: Apr. 25, 2001

(51) Int. Cl.[7] ............................................. H01L 21/66
(52) U.S. Cl. ............................. 438/14; 438/15; 438/16; 356/445; 356/376; 356/351; 356/349
(58) Field of Search ........................... 438/14, 15, 16; 356/445, 376, 351, 349

(56) References Cited

U.S. PATENT DOCUMENTS

| | | | |
|---|---|---|---|
| 5,867,276 A | 2/1999 | McNeil et al. | 356/445 |
| 5,877,276 A | 3/1999 | Borden | 356/376 |
| 5,880,838 A | 3/1999 | Marx et al. | 356/351 |
| 5,923,423 A * | 7/1999 | Sawatari et al. | 356/349 |
| 5,955,654 A * | 9/1999 | Stover et al. | 73/1.89 |
| 6,259,521 B1 * | 7/2001 | Miller et al. | 356/237.5 |

* cited by examiner

Primary Examiner—John F. Niebling
Assistant Examiner—Olivia Luk
(74) Attorney, Agent, or Firm—Williams, Morgan & Amerson, P.C.

(57) ABSTRACT

The present invention is directed to a method of using scatterometry measurements to control deposition processes, and a system for accomplishing same. In one embodiment the method comprises forming at least one grating structure above a substrate, performing a deposition process to form a process layer above the grating structure, and illuminating the process layer and the grating structure. The method further comprises measuring light reflected off of the process layer and the grating structure after the deposition process is started to generate an optical characteristic trace for the process layer and the grating structure comparing the generated optical characteristic trace to a target optical characteristic trace that corresponds to a process layer having a desired profile, and stopping the deposition process based upon the comparison of the generated trace and the target trace.

56 Claims, 3 Drawing Sheets

METHOD OF USING SCATTEROMETRY MEASUREMENTS TO CONTROL DEPOSITION PROCESSES

BACKGROUND OF THE INVENTION

1. Field of the Invention

This invention relates generally to semiconductor fabrication technology, and, more particularly, to a method of using scatterometry measurements to control deposition processes. and a system for accomplishing) same.

2. Description of the Related Art

There is a constant drive within the semiconductor industry to increase the operating speed of integrated circuit devices e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel lengths junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

Typically, integrated circuit devices are comprised of millions of transistors formed above a semiconducting substrate. By way of background, an illustrative field effect transistor 10, as shown in FIG. 1, may be formed above a surface 15 of a semiconducting substrate or wafer 11 comprised of doped-silicon. The substrate 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g. arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown). Additionally, although not depicted in FIG. 1, a typical integrated circuit device is comprised of a plurality of conductive interconnections, such as conductive lines and conductive contacts or vias, positioned in multiple layers of insulating material formed above the substrate 11.

Semiconductor manufacturing generally involves multiple processes whereby multiple layers of material are formed above a semiconducting substrate, and portions of those layers are selectively removed until such time as a completed device is formed. These layers may be patterned using known photolithography and etching techniques. In general, photolithography involves the process of forming a layer of photoresist material above one or more process layers in which a feature, e.g., a metal line, a gate electrode, an opening in a layer of insulating material, will be formed. Thereafter, a pattern that is desired to be transferred into the underlying process layer or layers will be formed in the layer of photoresist material. Then, using one or more etching processes, the underlying process layer is etched using the patterned layer of photoresist as a mask, thereby resulting in a patterned process layer that replicates the pattern formed in the layer of photoresist.

One illustrative process flow for forming a portion of the transistor 10 shown in FIG. 1 will now be described. Initially, a process layer comprised of a gate insulation material, e.g., silicon dioxide, is formed above the semiconducting substrate 11. Typically, this is accomplished by an oxidation process. Then, a process layer comprised of a gate electrode material, e.g., polysilicon, is formed above the process layer 17. The polysilicon layer may be formed by a variety of processes, e.g., by a chemical vapor deposition ("CVD") process. If desired, an anti-reflective coating layer (not shown) may also be formed above the polysilicon layer to reduce reflections during subsequent photolithography exposure processes. The anti-reflective coating layer may be comprised of a variety of materials, e.g., silicon nitride, silicon oxynitride, etc. Thereafter, a patterned layer (not shown) of photoresist material (positive or negative) is formed above the polysilicon layer using known photolithography techniques, and one or more etching processes will be performed to form a gate electrode structure 14 from the polysilicon layer using the patterned layer of photoresist as a mask.

One problem encountered with existing deposition processes used to form process layers is controlling the thickness of the deposited layer of material. Thickness control of various deposited layers, e.g., silicon dioxide, silicon nitride, silicon oxynitride, polysilicon. metals, etc., is very important in modern semiconductor manufacturing operations. For example, if a layer of insulating material, e.g., silicon dioxide, is made too thin, then conductive metal lines later formed therein may be thinner than anticipated, which may result in an increase in the resistance of the line. As another example, if an insulating layer is made thicker than anticipated by the design process, then subsequent etching processes that may be performed on the insulating layer may have to be performed for a duration that is longer than anticipated to remove the excess material, thereby increasing manufacturing time and reducing manufacturing efficiencies. Previously, the thickness of various deposited layers has been measured by a variety of metrology tools, such as an ellipsometer, a reflectomer, a spectrometer, or some combination thereof These tools tended to work well for measuring flat, uniform thin films, but many modern semiconductor manufacturing processes depend less upon uniform film thickness than surface topography or profile of the process layer. In short, what is desired is a metrology technique and control application that may provide a more robust technique for measurings or determining the topography or surface profile of a process layer, and a method and system for controlling surface planarity using the improved metrology technique and system.

The present invention is directed to a method and system that may solve or at least reduce, some or all of the aforementioned problems.

SUMMARY OF THE INVENTION

The present invention is directed to a method of using scatterometry measurements to control deposition processes, and a system for accomplishing same. In one embodiment, the method comprises forming at least one grating structure above a substrate, performing a deposition process to form a process layer above the gratings structure, and illuminating the process layer and the grating structure. The method further comprises measuring light reflected off of the process layer and the grating structure after the deposition process is started to generate an optical characteristic trace for the process layer and the grating structure, comparing the generated optical characteristic trace to a target optical characteristic trace that corresponds to a process layer having a desired surface profile, and controlling the deposition process based upon the comparison of the generated trace and the target trace,

BRIEF DESCRIPTION OF THE DRAWINGS

The invention may be understood by reference to the following description taken in conjunction with the accompanying drawings, in which like reference numerals identify like elements, and in which.

Figure 1:
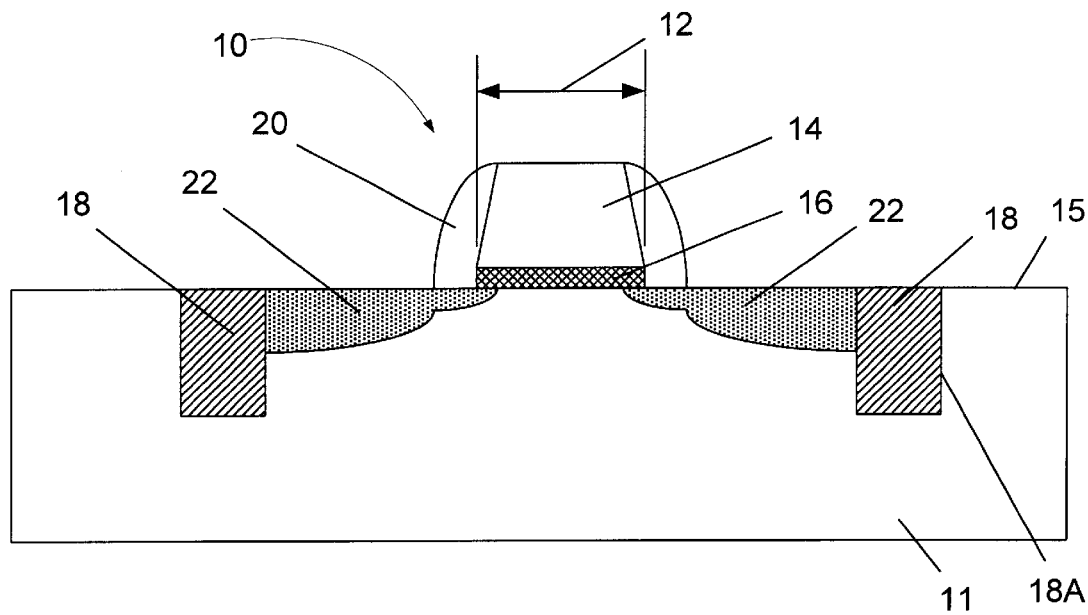
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to a method of using scatterometry measurements to control deposition processes, and a system for accomplishing same. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Semiconductor manufacturing generally involves the formation of many process layers or films of materials above a semiconducting substrate. The process layers may be comprised of many different types of materials, e.g., insulating materials such as silicon dioxide and silicon oxynitride, etch stop layers such as silicon nitride, metals such as aluminum, other materials such as polysilicon, etc. Many of these layers are formed by a deposition process, e.g., chemical vapor deposition (CVD), physical vapor deposition (PVD), plasma enhanced chemical vapor deposition (PECVD), low pressure chemical vapor deposition (LPCVD), high density plasma (HDP) deposition, etc. For many applications, it is desirable that the thickness of such layers, both in an absolute sense and in relation to its thickness above or below certain other features, be accurately controlled. As will be understood by those skilled in the art after reading the present application, the invention disclosed herein is readily applicable to a variety of process layers, e.g., insulating materials, metals, polysilicon, etc., that may be formed by a variety of deposition techniques, e.g., CVD. PECVD, LPCVD), PVD, etc.

Figure 2:
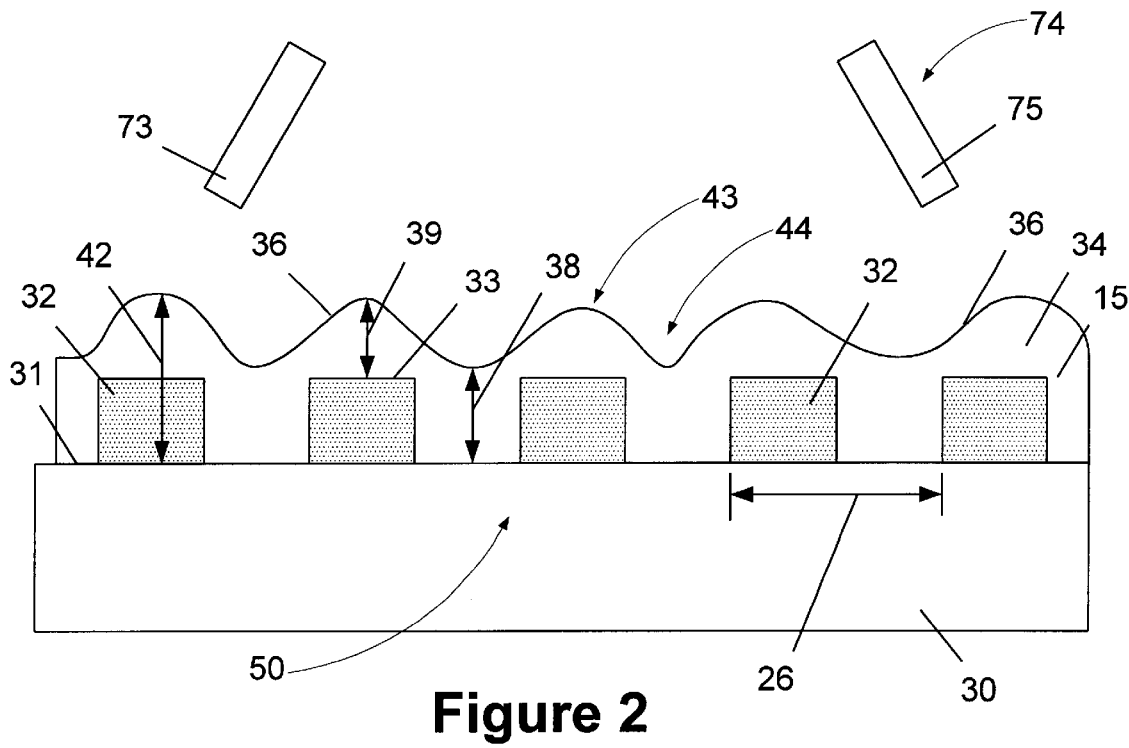
FIG. 2 is a cross-sectional view of a process layer formed above a plurality of features.

FIG. 2 depicts one illustrative process layer 34 that may be formed in accordance with the present invention. As shown therein, a plurality of features 32 are formed above a structure 30, and the process layer 34 is formed above the features 32. The structure 30 is intended to be representative of any type of structure commonly found in semiconductor manufacturing operations above which a process layer 34 may be formed above. For example, the structure 30 may be a semiconducting substrate, or one or more previously formed layers of materials, e.g., an inter-layer dielectric layer. Similarly, the features 32 are intended to be representative of any of a variety of types of features that may be formed in semiconductor manufacturing operations, e.g., metal lines, gate electrode stacks, etc. In one illustrative embodiment, the features 32 are conductive lines comprised of aluminum. The size and shape of the features 32 may be varied as a matter of design choice.

The process layer 34 may be comprised of a variety of materials, e.g., an insulating material, a metal, polysilicon, etc. In one illustrative embodiment where the features 32 are conductive metal lines, the process layer 34 may be comprised of a deposited layer of insulating material, such as silicon dioxide, silicon oxynitride, or any other material having a dielectric constant less than approximately 5. As deposited, the process layer 34 has a surface 36 that is comprised of a plurality of peaks 43 and valleys 44 due to the presence of the underlying features 32 and the gaps therebetween. These peaks 43 and valleys 44 define the surface profile or surface topography of the process layer 34.

The topography of the process layer 34 may vary across the surface 36 of the process layer 34. For example, the maximum or peak thickness of the process layer 34 relative to the surface 31 of the structure 30 is indicated by an arrow 42. The thickness of the process layer 34 at the valleys relative to the surface 31 is indicated by an arrow 38. Finally, the thickness of the process layer 34 at locations above the top surface 33 of the feature 32 is indicated by an arrow 39.

Figure 3:
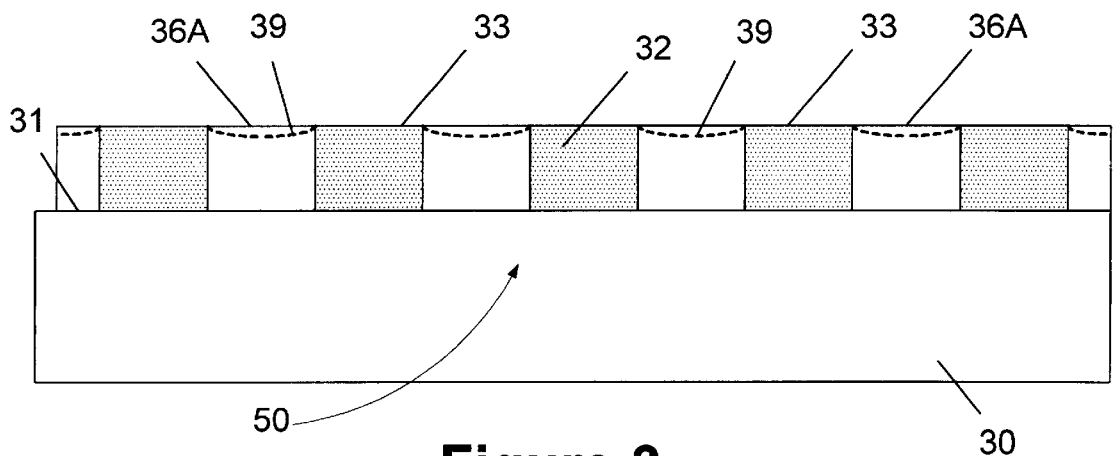
FIG. 3 is a cross-sectional view of the structure shown In FIG. 2 after it has been subjected to a chemical mechanical polishing operation.

The surface topography of the process layer 34 is a factor in subsequent processing operations. As shown in FIG. 3, a chemical mechanical polishing operation will typically be performed to remove excessive amounts of the process layer 34, i.e., until the polishing surface 36A of the process layer 34 is approximately planar with the surfaces 33 of the features 32. Over-polishing of the process layer 34 results in undesirable dishing or erosion (as indicated by dashed lines 39) of the process layer 34 between the features 32. Conversely, under-polishing may result in the process layer 34 material not being completely removed from above the surface 33 of the features 32, resulting in sub-optimal lithography for subsequent masking layers.

Figure 4:
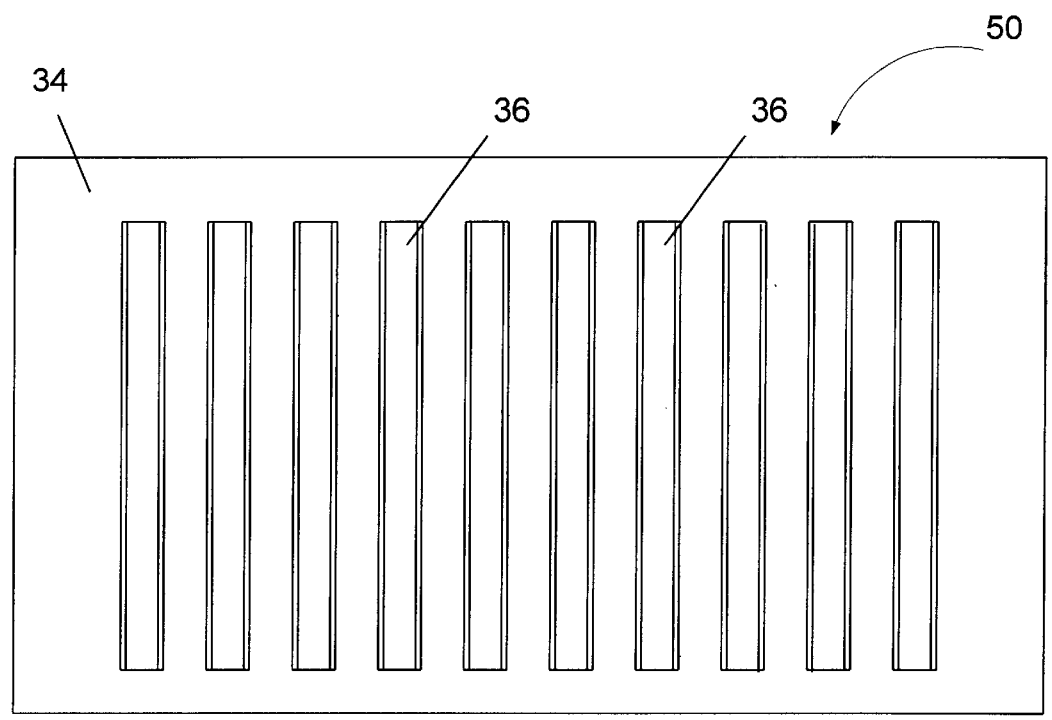
FIG. 4 is a plan view of an illustrative grating structure formed above a structure in accordance with one embodiment of the present invention.

As shown in FIGS. 3 and 4, the features 32 define a grating structure 50. The features 32 comprising the grating structure 50 may have a pitch 26 that, in one embodiment, may vary from approximately 0.5–2.0 μm. A plurality of such grating structures 50 may be formed at various locations across the surface 31 of the structure 30. The grating structure 50 may be a separate test structure, or in some embodiments, it may be comprised of features 32 that are used to form actual production devices. For or example, the grating structure 50 may be essentially a test structure that is formed in an area defined by a scribe line of a wafer. The features 32 that are part of the grating structure 50 may be formed at the same time that similar features 32 are being formed for production devices formed on the wafer.

Depending upon the type of integrated circuit device under consideration, and/or as a matter of design choice, the grating structure(s) 50 may be comprised of features 32 that are used to form actual production integrated circuit devices. For example, for memory devices. the features 32 comprising the grating structure 50 may be used in producing gate electrode type structures that are part of the completed memory device. The size, shape and configuration of the grating structure 50 may be varied as a matter of design choice. For example, the grating structure 50 may be formed in an area having approximate dimensions of 100 μm×120 μm, and it may be comprised of approximately 500–1500 features 32 (depending upon the selected pitch).

As depicted in FIG. 2, the topography of the process layer 34 varies across the surface 31 of the structure 30. Through use of scatterometry techniques, a target optical characteristic trace may be established for a desirable topography or surface profile of the surface 36 of the process layer 34. The target optical characteristic trace represents the profile of the surface 36 of the process layer 34 that, when subjected to a chemical mechanical polishing operation results in a desirable profile of the polishing surface 36A, e.g., one with little or no, or at least acceptable levels, of dishing and under-polishing. Thereafter, as explained more fully below, scatterometry techniques may be used to control the deposition process used to form the process layer 34. For example, in one illustrative embodiment, scatterometry techniques may be used to stop or endpoint the deposition process used to form the process layer 34 such that the profile of the surface 36 matches or closely approximates (within specified tolerances) the target optical characteristic trace for a profile of the surface 36 that produces acceptable results in subsequent chemical mechanical polishing operations.

The target profile may be established by a variety of techniques. For example, the target profile trace may be established by performing various metrology tests on a process layer 34 before and after it is subjected to a chemical mechanical polishing process. For example, prior to polishing, the surface profile or topography of the surface 36 of the process layer 34 may be measured using a profilometer and various thickness measurements of the process layer 34 may be taken using an ellipsometer. Thereafter, the process layer 34 may be polished. Then, various metrology tests may be performed, both destructive and non-destructive, to determine the acceptability of the polishing operations. Once acceptable polishing results are obtained, then an optical characteristic trace may be established (by calculation using Maxwell's equations) for a process layer 34 having a profile that approximates or matches the profile of the process layer 34 that produced the acceptable wafers after polishing operations were complete.

Alternatively, prior to polishing a process layer 34, a scatterometry tool may be used to measure or generate an optical characteristic trace for the process layer 34, having a certain surface topography, and grating structure 50 on one or more wafers. After polishing operations are completed, it may be determined which of the wafers produced the most acceptable finished product after polishing. The generated optical characteristic trace for that process layer 34 and grating structure 50 is then declared to be the target profile trace that will be used in controlling deposition processes used to for subsequent process layers 34 on subsequently processed wafers.

Also depicted in FIG. 2 is an illustrative scatterometry tool 74 comprised of, among other things, a representative light source 73 and a detector 75. Ultimately, the process layer 34 and the grating structure 50 will be measured using scatterometric techniques, and these measurements will be used to determine and/or confirm the endpoint of the deposition process used to form the process layer 34.

Figure 5:
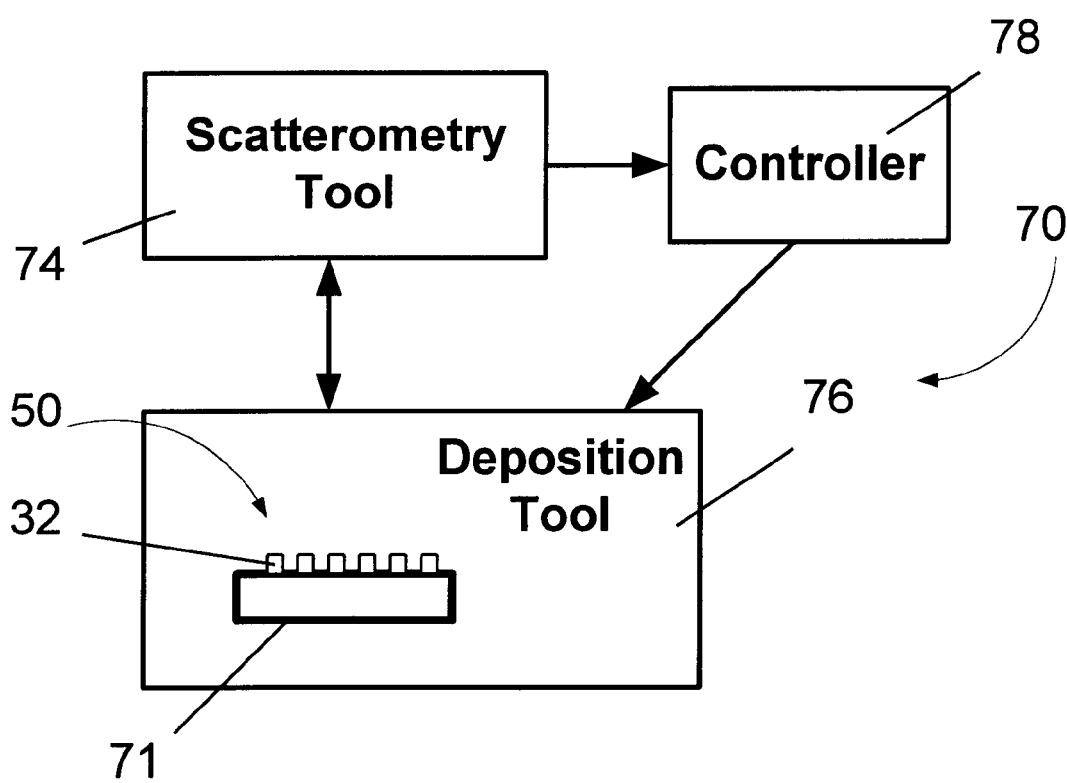
FIG. 5 depicts a system in accordance with one illustrative embodiment of the present invention.

An illustrative system 70 that may be used in one embodiment of the present invention is shown in FIG. 5. The system 70 is comprised of a scatterometry tool 74, a deposition tool 76, and a controller 78. An illustrative wafer 71 is also depicted in FIG. 5. The wafer 71 is representative of wafers processed to the point where a process layer 34 comprised of any of a plurality of materials is to be formed above the wafer in the deposition tool 76. At least one orating structure 50 comprised of a plurality of features 32 has also been formed above the wafer 71. An illustrative deposition tool 76 that may be used with the present invention is a Sequel II CVD tool sold by Novellus. In one embodiment, the scatterometry tool 74 is an in-situ tool that is mounted to or integrated with the deposition tool 76.

A variety of scatterometry tools 74 may be used with the present invention. e.g., so-called 2θ-type systems and lens-type scatterometry tools. The scatterometry tool 74 may use white light, or some other wavelength or combination of wavelengths, depending on the specific implementation. Typically, the scatterometry tool 74 will generate an incident beam that has a wide spectral composition and wherein the intensity of the light changes slowly in comparison to changes in wavelength. The angle of incidence of the light may also vary, depending on the specific implementation. The profile traces generated by the scatterometry tool 74 may be based upon a comparison of light intensity to wavelength (for white light. fixed angle type scatterometry tools) or a comparison of intensity to incident angle (for angle resolved systems that use a single light source). For example, a spectroscopic ellipsometer (single angle, many wavelengths), or a laser (single wavelength, many angles) may be used with the present invention. Additionally the light source 73 and the detector 75 may be arranged in a pattern of concentric circles, with the light source 73 illuminating the grating structure 50 from a perpendicular orientation, e.g., a reflectometer. The intensity of the reflected light may be measured as s- and p-polarization over either multiple angles or at multiple wavelengths.

In general, the scatterometry tool 74 (see FIG. 5) includes optical hardware, such as an ellipsometer or reflectometer, and a data processing unit loaded with a scatterometry software application for processing data collected by the optical hardware, For example, the optical hardware may include a Model OP5230 or OP5240 with a spectroscopic ellipsometer offered by Thermawave, Inc. of Fremont, Calif. The data processing unit may comprise a profile application server manufactured by Timbre Technologies, a fully owned subsidiary of Tokyo Electron America, Inc. of Austin, Tex. and distributed by Thermawave, Inc.

In one embodiment, the present invention is directed to the use of scatterometric techniques to control a deposition process. For example, the present invention may be used to endpoint a deposition process, or to reduce or increase the deposition rate of such a process. That is, the scatterometry tool 74 is used to measure or generate an optical characteristic trace of the process layer 34 and the grating structure 50 at various times after the process used to form the process layer 34 is started, The measured or generated optical characteristic trace is compared to a pre-established or target optical characteristic trace for a process layer 34 having a desirable, as-deposited surface 36 profile. This target profile of the surface 36 of the process layer 34 is one that produces acceptable results when the wafer is subjected to subsequent polishing operations. This target optical characteristic trace may be stored in a library in the scatterometry tool 74. Alternatively, as the magnitude of the difference between the generated trace and the target trace decreases, the deposition rate of the process may be reduced.

The scatterometry tool 74 is used to measure or generate an optical characteristic trace of the process layer 34 after the deposition process has been started. The frequency of the measurements taken by the scatterometry, tool 74 may be varied as a matter of design choice. For example, during a typical deposition process, the scatterometry tool 74 may generate an optical characteristic trace for the process layer 34 and the grating structure 50 approximately every 2–5 seconds. Measurements may also be taken at different rates during the duration of the deposition process, i.e., more measurements may be taken as the process nears endpoint. The deposition process may or may not be stopped during the period when the scatterometry measurements are being taken.

The optical characteristic trace generated by the scatterometry tool 74 may then be compared to the target optical characteristic trace. This comparison may be made within the scatterometry tool 74, or it may be made by the controller 78, or it may be made by some other controller within the manufacturing facility. Through use of this technique, the target optical characteristic trace may be used to endpoint the deposition process when the to measured optical characteristic trace of the process layer 34 and the grating structure 50 closely approximates or matches the target trace within some preselected specified tolerances. More particularly, when it is determined that the measured trace matches or closely approximates the target trace, the controller 78 may stop the deposition process performed in the deposition tool 74.

The optical measurements of the process layer 34 may be performed on any desired number of wafers For example, such measurements may be performed on all wafers in one or more lots, or on a representative number of wafers in a given lot. A single substrate may contain a plurality of grating structures 50, and they may be spaced out above the surface of the substrate. Any number of such grating structures may be measured.

As a result of the present invention, process layers 34 may be formed with a more desired thickness and/or surface profile, and the formation process may be more precisely controlled. This results in the consistent production of process layers 34 having desired surface profile characteristics that will enable subsequently polishing operations to be performed more efficiently and effectively. Ultimately, the present invention may be useful in producing more integrated circuit devices within acceptable tolerance levels. Accordingly. manufacturing efficiencies may be improved. Through use of the present invention, better process control may be achieved in modem integrated circuit manufacturing facilities. For example, the present invention may enable more precise polarization of various process layers employed in integrated circuit devices, thereby improving device performance and increasing production yields.

In the illustrated embodiments, the controller 78 is a computer programmed with software to implement the functions described herein. Moreover, the functions described for the controller 78 may be performed by one or more controllers spread through the system. For example, the controller 78 may be a fab level controller that is used to control processing operations throughout all or a portion of a semiconductor manufacturing facility. Alternatively, the controller 78 may be a lower level computer that controls only portions or cells of the manufacturing facility. Moreover, the controller 78 may be a stand-alone device, or it may reside on the etch tool 76. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 78, as described. is the Catalyst system offered by KLA Tencor, Inc. The Catalyst system uses Semiconductor Equipment and Materials International (SIMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The present invention is directed to a method of using scatterometry measurements to control deposition processes, and a system for accomplishing same. In one embodiment, the method comprises forming at least one grating structure 50 above a substrate, performing a deposition process to form a process layer 34 above the grating structure 50, and illuminating the process layer 34 and the grating structure 50. The method further comprises measuring light reflected off of the process layer 34 and the grating structure 50 after the deposition process is started to generate an optical characteristic trace for the process layer 34 and the grating structure 50, comparing the generated optical characteristic trace to a target optical characteristic trace that corresponds to a process layer having a desired profile, and stopping the deposition process based upon the comparison of the generated trace and the target trace.

The present invention is also directed to a system 70 capable of performing the inventive methods described herein. In one embodiment, the system is comprised of a deposition tool 76, a scatterometry tool 74 and a controller 78. The deposition tool 76 is adapted to form a process layer 34 above a grating structure 50 comprised of a plurality of features. The scatterometry tool 74 is adapted to illuminate the process layer 34 and the grating structure 50 and measure light reflected off of the grating structure 50 after the deposition process in the deposition tool 76 is started to generate an optical characteristic trace for the process layer 34 and the grating structure 50. The scatterometry tool 74 then compares the generated optical characteristic trace to a target optical characteristic trace established for the process layer 34 and the grating structure 50, wherein the surface 36 of the process layer 34 has a desired surface and/or thickness profile, The controller 78 stops the deposition process based upon a comparison of the measured trace and the target trace. In a more particular embodiment, the controller 78 stops the deposition process when the measured optical characteristic trace closely approximates the target trace.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming at least one grating structure above a substrate;
    performing a deposition process to form a process layer above said grating structure;
    illuminating said process layer and said at least one grating structure;
    measuring light reflected off of said process layer and said at least one grating structure after said deposition process is started to generate an optical characteristic trace for said process layer and said grating structure;
    comparing said generated optical characteristic trace to a target optical characteristic trace that corresponds to a process layer having a desired surface profile; and
    controlling said deposition process based upon said comparison of said generated trace and said target trace.

2. The method of claim 1, wherein forming at least one grating structure above a substrate comprises forming at least one grating structure above a scribe line of a substrate.

3. The method of claim 1, wherein forming at least one grating structure above a substrate comprises forming at least one grating structure above a production die on a substrate.

4. The method of claim 1, wherein forming at least one grating structure above a substrate comprises forming at least one grating structure comprised of a plurality of conductive lines above a substrate.

5. The method of claim 1, wherein forming at least one grating structure above a substrate comprises forming at least one grating structure comprised of a plurality of gate electrode structures above a substrate.

6. The method of claim 1, wherein performing a deposition process to form a process layer above said grating structure comprises performing at least one of a CVD, PVD, PECVD and LPCVD deposition process to form a process layer above said grating structure.

7. The method of claim 1, wherein performing a deposition process to form a process layer above said grating structure comprises performing a deposition process to form a process layer comprised of at least one of a metal, polysilicon, and a material having a dielectric constant less than 5 above said grating structure.

8. The method of claim 1, wherein forming at least one grating structure above a substrate comprises forming at least one grating structure above a substrate in an area having dimensions of approximately 100 $\mu$m×120 $\mu$m or less.

9. The method of claim 1, wherein measuring light reflected off of said process layer and said grating structure after said deposition process is started comprises measuring light reflected off of said process layer and said grating structure during said deposition process.

10. The method of claim 1, wherein measuring light reflected off of said process layer and said grating structure after said deposition process is started comprises measuring light reflected off of said process layer and said grating structure at a plurality of different times after said deposition process is started to generate an optical characteristic trace for said process layer and said grating structure during each such measurement.

11. The method of claim 10, further comprising comparing at least some of said generated optical characteristic traces to said target optical characteristic trace.

12. The method of claim 11, further comprising stopping said deposition process based upon said comparison of said at least some generated traces and said target trace.

13. The method of claim 1, wherein said comparison of said generated optical characteristic trace to said target optical characteristic trace is performed in a scatterometry tool.

14. The method of claim 1, wherein stopping said deposition process based upon said comparison of said generated trace and said target trace comprises stopping said deposition process when said generated trace and said target trace match.

15. The method of claim 1, wherein controlling the deposition process includes stopping the deposition process.

16. The method of claim 1, wherein controlling the deposition process includes decreasing a deposition rate of said deposition process.

17. The method of claim 1, wherein controlling the deposition process includes increasing a deposition rate of said deposition process.

18. A method comprising:
   forming at least one grating structure above a substrate;
   performing a deposition process to form a process layer above said grating structure;
   illuminating said process layer and said at least one grating structure;
   measuring light reflected off of said process layer and said at least one grating structure after said deposition process is started to generate an optical characteristic trace for said process layer and said grating structure;
   comparing said generated optical characteristic trace to a target optical characteristic trace that corresponds to a process layer having a desired surface profile; and
   stopping said deposition process based upon said comparison of said generated trace and said target trace.

19. The method of claim 18, wherein forming at least one grating structure above a substrate comprises forming at least one grating structure above a scribe line of a substrate.

20. The method of claim 18, wherein forming at least one grating structure above a substrate comprises forming at least one grating structure above a production die on a substrate.

21. The method of claim 18, wherein forming at least one grating structure above a substrate comprises forming at least one grating structure comprised of a plurality of conductive lines above a substrate.

22. The method of claim 18, wherein forming at least one grating structure above a substrate comprises forming at least one grating structure comprised of a plurality of gate electrode structures above a substrate.

23. The method of claim 18, wherein performing a deposition process to form a process layer above said grating structure comprises performing at least one of a CVD PVD, PECVD and LPCVD deposition process to form a process layer above said grating structure.

24. The method of claim 18, wherein performing a deposition process to form a process layer above said grating structure comprises performing a deposition process to form a process layer comprised of at least one of a metal, polysilicon, and a material having a dielectric constant less than 5 above said grating structure.

25. The method of claim 18, wherein forming at least one grating structure above a substrate comprises forming at least one grating structure above a substrate in an area having dimensions of approximately 100 $\mu$m×120 $\mu$m or less.

26. The method of claim 18, wherein measuring light reflected off of said process layer and said grating structure after said deposition process is started comprises measuring light reflected off of said process layer and said grating structure during said deposition process.

27. The method of claim 18, wherein measuring light reflected off of said process layer and said grating structure after said deposition process is started comprises measuring light reflected off of said process layer and said grating structure at a plurality of different times after said deposition process is started to generate an optical characteristic trace for said process layer and said grating structure during each such measurement.

28. The method of claim 27, further comprising comparing at least some of said generated optical characteristic traces to said target optical characteristic trace.

29. The method of claim 28, further comprising stopping said deposition process based upon said comparison of said at least some generated traces and said target trace.

30. The method of claim 18, wherein said comparison of said generated optical characteristic trace to said target optical characteristic trace is performed in a scatterometry tool.

31. The method of claim 18, wherein stopping said deposition process based upon said comparison of said generated trace and said target trace comprises stopping said deposition process when said generated trace and said target trace match.

32. A method, comprising:
   forming at least one grating structure above a substrate;
   performing a deposition process to form a process layer above said grating structure;
   illuminating said process layer and said at least one grating structure;
   measuring light reflected off of said process layer and said at least one grating structure during said deposition process to generate an optical characteristic trace for said process layer and said grating structure;
   comparing said generated optical characteristic trace to a target optical characteristic trace that corresponds to a process layer having a desired surface profile; and
   stopping said deposition process based upon said comparison of said generated trace and said target trace.

33. The method of claim 32, wherein forming at least one grating structure above a substrate comprises forming at least one grating structure above a scribe line of a substrate.

34. The method of claim 32, wherein forming at least one grating structure above a substrate comprises forming at least one grating structure above a production die on a substrate.

35. The method of claim 32, wherein forming at least one grating structure above a substrate comprises forming at least one grating structure comprised of a plurality of conductive lines above a substrate.

36. The method of claim 32, wherein forming at least one grating structure above a substrate comprises forming at least one grating structure comprised of a plurality of gate electrode structures above a substrate.

37. The method of claim 32, wherein performing a deposition process to form a process layer above said grating structure comprises performing at least one of a CVD, PVD, PECVD and LPCVD deposition process to form a process layer above said grating structure.

38. The method of claim 32, wherein performing a deposition process to form a process layer above said grating structure comprises performing a deposition process to form a process layer comprised of at least one of a metal polysilicon, and a material having a dielectric constant less than 5 above said grating structure.

39. The method of claim 32, wherein forming at least one grating structure above a substrate comprises forming at least one grating structure above a substrate in an area having dimensions of approximately 100 $\mu$m×120 $\mu$m or less.

40. The method of claim 32, wherein measuring light reflected off of said process layer and said grating structure during said deposition process comprises measuring light reflected off of said process layer and said grating structure at a plurality of different times during said deposition process to generate an optical characteristic trace for said process laser and said grating structure during each such measurement.

41. The method of claim 41, further comprising comparing at least some of said generated optical characteristic traces to said target optical characteristic trace.

42. The method of claim 42, further comprising stopping said deposition process based upon said comparison of said at least some generated traces and said target trace.

43. The method of claim 32, wherein said comparison of said generated optical characteristic trace to said target optical characteristic trace is performed in a scatterometry tool.

44. The method of claim 32, wherein stopping said deposition process based upon said comparison of said generated trace and said target trace comprises stopping said deposition process when said generated trace and said target trace match.

45. A method comprising:

forming at least one grating structure above a substrate;

performing a deposition process to form a process layer above said grating structure;

illuminating said process layer and said at least one grating structure;

measuring light reflected off of said process layer and said at least one grating structure at a plurality of different times after said deposition process is started to generate an optical characteristic trace for said process layer and said grating structure during each of said measurements;

comparing at least some of said generated optical characteristic traces to a target optical characteristic trace that corresponds to a process layer having a desired surface profile; and stopping said deposition process based upon said comparison of at least one of said generated traces and said target trace.

46. The method of claim 45, wherein forming at least one grating structure above a substrate comprises forming at least one grating structure above a scribe line of a substrate.

47. The method of claim 45, wherein forming at least one grating structure above a substrate comprises forming at least one grating structure above a production die on a substrate.

48. The method of claim 45, wherein forming at least one grating structure above a substrate comprises forming at least one grating structure comprised of a plurality of conductive lines above a substrate.

49. The method of claim 45, wherein forming at least one grating structure above a substrate comprises forming at least one grating structure comprised of a plurality of gate electrode structures above a substrate.

50. The method of claim 45, wherein performing a deposition process to form a process layer above said grating structure comprises performing at least one of a CVD, PVD, PECVD and LPCVD deposition process to form a process layer above said grating structure.

51. The method of claim 45, wherein performing a deposition process to form a process layer above said grating structure comprises performing a deposition process to form a process layer comprised of at least one of a metal, polysilicon, and a material having a dielectric constant less than 5 above said grating structure.

52. The method of claim 45, wherein forming at least one grating structure above a substrate comprises forming at least one grating structure above a substrate in an area having dimensions of approximately 100 $\mu$m×120 $\mu$m or less.

53. The method of claim 45, wherein measuring light reflected off of said process layer and said grating structure after said deposition process is started comprises measuring light reflected off of said process layer and said grating structure during said deposition process.

54. The method of claim 45, wherein measuring light reflected off of said process layer and said grating structure after said deposition process is started comprises measuring light reflected off of said process layer and said grating structure at a plurality of different times during said deposition process to generate an optical characteristic trace for said process layer and said grating structure during each such measurement.

55. The method of claim 45, wherein said comparison of at least some of said generated optical characteristic traces to said target optical characteristic trace is performed in a scatterometry tool.

56. The method of claim 45, wherein stopping said deposition process based upon said comparison of at least some of said generated traces and said target trace comprises stopping said deposition process when at least some of said generated traces and said target trace match.

* * * * *